United States Patent [19]
Altmann et al.

[11] Patent Number: 5,708,391
[45] Date of Patent: Jan. 13, 1998

[54] HIGH FREQUENCY DIFFERENTIAL FILTER WITH CMOS CONTROL

[76] Inventors: Michael Altmann, 12 Barrow Crescent, Kanata, Ontario, Canada, K2L 2K1; Bernard Guay, 2625 Rufus-Rockhead #203, Montreal, Quebec, Canada, H3J 2W5

[21] Appl. No.: 643,140
[22] Filed: May 2, 1996
[51] Int. Cl.⁶ .................. H03F 3/45; H03F 3/191
[52] U.S. Cl. ............................. 330/252; 330/303
[58] Field of Search ........................ 330/252, 254, 330/261, 303, 306, 51

[56] References Cited

U.S. PATENT DOCUMENTS 5,227,737 7/1993 Sutliff et al. .................. 330/254
5,255,790 10/1993 Noguchi et al. ................ 330/260
5,384,501 1/1995 Koyama et al. ................ 327/336
5,448,311 9/1995 White et al. ................. 330/254 X

*Primary Examiner*—Steven Mottola
*Attorney, Agent, or Firm*—Aprilia U. Diaconescu

[57] ABSTRACT

A programmable high frequency active filter comprises a plurality of basic building blocks connected in parallel. A basic building block includes a transistor pair connected in a differential amplifier configuration, an impedance connected between the emitters of the transistors and a switching block for applying the necessary bias current to the transistors. The transfer function of the filter is programmed with a digital word, the length of which determines the number of basic building blocks included in the configuration. In this way, the equivalent high frequency impedance of the filter is controlled by selecting the configuration and the value of the impedance of each building block.

22 Claims, 7 Drawing Sheets

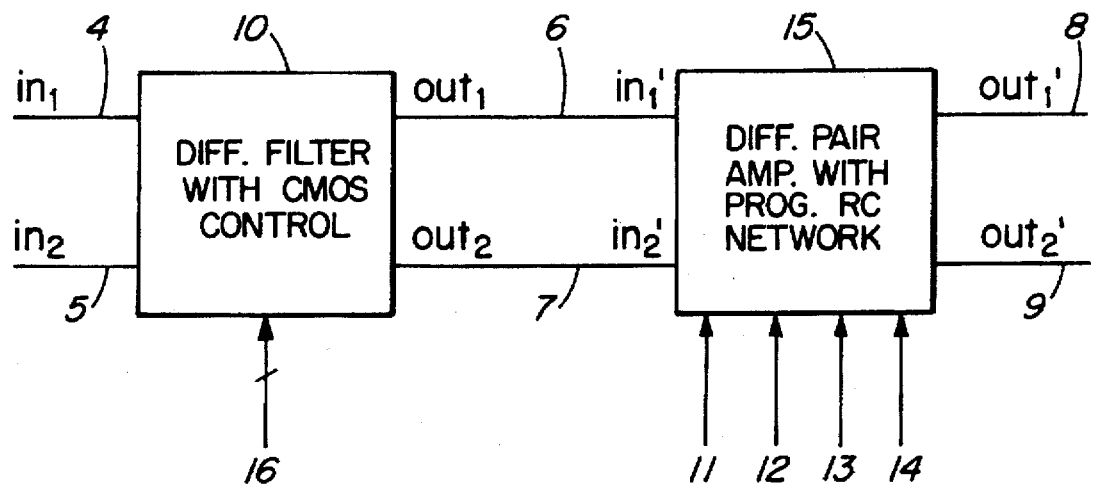
FIG. IA
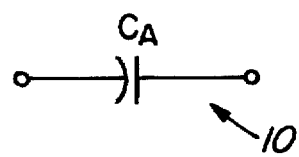
FIG. IB
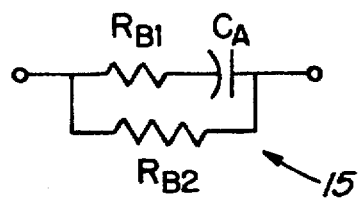
FIG. IC

HIGH FREQUENCY DIFFERENTIAL FILTER WITH CMOS CONTROL

BACKGROUND OF THE INVENTION

1. Field of the Invention

This invention relates to a high frequency differential filter and more particularly to a circuit for filtering of signals up to very high frequencies in such a way that the filter function is programmable.

2. Background Art

Modern telephone communication lines not only carry voice and supervisory signals which lie within a low-frequency range less than 3 kHz, but also serve to convey data signals in a high-frequency range which may be as high as several GHz. Because ordinary telephone lines have a poor amplitude response in the high frequency range, it is present practice to interpose an equalizing module in the line at the receiver side to afford a substantially uniform signal gain over a broad frequency spectrum including the majority of the power of the signal, generally from DC to half the symbol rate applied to the cable.

A telephone line equalizer is a device adapted to correct or compensate for some specified characteristic of the line which is regarded as undesirable. By the use of an equalizer, one can improve particular line characteristics and thereby enhance the quality or grade of the received signal. As the losses of a telephone line are such that its amplitude response falls off as the frequency of the signal carried over the line increases, the equalizer generally is designed to provide a rising gain with an increase in frequency. Proper adjustment of the equalizer is attained when the equalizer compensates for the line losses over the entire band of useful frequencies.

In general, the equalizer is a filter whose structure is described with integrators and amplifiers connected in feedback and feed forward topologies, which are difficult to realize in practical circuits at high frequencies. Currently, designers are forced to use simpler lossy integrators and differentiators for high speed (>50 MHz) applications. Universal programmable active filters generally employ operational amplifiers with some form of resistive feedback loop from the output to the negative input, to allow the flow of current from the inverting input to the output of the operational amplifier. When the signal spectrum exceeds 20 MHz, bipolar processes of 10 GHz and higher are currently used. The resistor is switched into and out of the feedback path using MOS switches. However, resistors are difficult to integrate on a single silicon chip so as to be switched into and out, due to distortions and inaccuracy of resulting resistance value, which is difficult to control. To circumvent this problem, prior art filters use external resistors rather than on-chip resistors.

Other prior art filters use capacitors in the feedback path. Capacitors are easier to fabricate in a small area of the chip, and they can also be accurately switched with MOS switches. However, a capacitor does not permit DC current to flow, which prevents the inverting input node from periodically being brought back to the DC offset voltage of the operational amplifier as required, so that resistors must be also connected in parallel for the necessary DC path. Integration of such circuits into a single chip requires significant silicon area. In addition, due to the length of feedback paths obtained in this way, delays and parasitic impedances are accumulated and therefore the ability to synthesize high frequencies is limited.

For example, U.S. Pat. No. 5,225,790 (Noguchi et al., issued Jul. 6, 1993 to Digital Equipment Corporation) discloses a wideband, programmable first and second order filter network which provides constant gain and normalized frequency response as the resonant frequency is varied. The filter comprises a differential pair of transistors with the emitters coupled through a capacitor. A positive feedback circuit feeds the differential pair through a resistive circuit and a control circuit is coupled to the amplifier to provide adjustable frequency control by varying the respective emitter currents and the respective collector loads. Besides the disadvantages discussed above in connection with the feedback, the control circuit disclosed in this patent is a multiplier circuit of a complicated structure. At high frequencies, this circuit becomes difficult to realize in practice.

In addition, at high frequencies, the relative tolerance of all elements is larger due to the generally smaller values and sizes used for capacitors, resistors and active elements and the finite tolerance on component dimensions. Compensation for these factors is made easier by the use of programmable elements, if performance is not compromised.

In this description, "very high frequency" is a relative term indicating that the required frequency of operation is such that the transconductance of available active elements is reduced to the point where the device power gain is approaching unity.

SUMMARY OF THE INVENTION

It is an object of this invention to reduce or eliminate the drawbacks of the prior art high frequency filters.

It is another object of this invention to provide a filter structure which adds gain at high frequencies while not modifying low frequencies of the input signal.

Still another object of this invention is to provide a programmable filter for very high frequencies which is essentially unaffected by the electronics of the controlling signal. The filter disclosed herein is controlled by a CMOS signal, and is capable of using various differential signal formats in the signal path.

Another object of the invention is to create a filter element which can be combined with other such elements to create a programmable filter of increased complexity.

Accordingly, this invention provides a programmable high frequency active filter for receiving a differential input signal and providing a differential output signal, the filter comprising a differential amplifier comprising a first and second transistor, the first transistor having a first load and being biased with a first bias current source, the second transistor having a second load and being biased with a second bias current source; an impedance connected between the emitters of the pair of transistors for providing a frequency dependent differential voltage gain for the amplifier; and a switching block for connecting and disconnecting the first and second bias current sources to the first and second transistors, respectively, according to a digital control signal.

The invention also provides a programmable high frequency active filter for receiving a differential input signal and providing a differential output signal, the filter comprising a plurality (N) of differential amplifiers connected in parallel, each differential amplifier $AMP_i$, where i is an integer and i$\in$[1, N], comprising a first and a second transistor having a first load and being biased with a first bias current source, the second transistor having a second load and being biased with a second bias current source; a like plurality (N) of impedance units, each impedance unit being associated with a differential amplifier, an impedance unit $Z_i$ being connected between the emitters of the differential amplifier AMP$_i$ for providing a frequency dependent differential voltage gain for the differential amplifier AMP$_i$; and a like plurality (N) of switching blocks, each switching block being associated with a differential amplifier, a switching block SW$_i$ for connecting and disconnecting the first and second bias current source of the differential amplifier AMP$_i$ to the first and second transistor, respectively, according to a digital control signal.

The invention further provides a programmable high frequency active filter for receiving a differential input signal and providing a differential output signal, the filter comprising a differential amplifier comprising a first and second transistor, the first transistor having a first load resistor and being biased with a first bias current source, the second transistor having a second load resistor and being biased with a second bias current source; a capacitive network connected between the emitters of the first and second transistors for providing a frequency dependent differential voltage gain for the amplifier; a first MOS device connected with the drain and source between the emitter of the first transistor and the first current source; a second MOS device connected with the drain and source between the emitter of the second transistor and the second current source; a third MOS device connected with the source and drain between the collector of the first transistor and the first current source; and a fourth MOS device connected with the source and drain between the collector of the first transistor and the second current source; and wherein the gates of all the MOS devices are connected to receive the digital control signal.

A significant feature of this invention over the existing systems is that it makes it possible to program the gain for the high frequency band.

The high frequency differential filter with CMOS control of this invention may be used for a completely integrated transceiver solution for 155 Mb/s transmission over Category 5 unshielded twisted pair cabling (UPT-V). The design of this invention may be used as well in many other applications where a programmable high frequency filter is needed. The technology disclosed herein is viewed as a key technology for introduction of ATM transport to the desktop. A major challenge for achieving this goal is the large scale integration of analog and digital circuitry at 155 MHz and above.

BRIEF DESCRIPTION OF THE DRAWINGS

The foregoing and other objects, features and advantages of the invention will be apparent from the following more particular description of the preferred embodiments, as illustrated in the appended drawings, where:

FIG. 1A is a block diagram of an equalizer using programmable filters according to this invention;

FIG. 1B illustrates the equivalent impedance for the high frequency building block filter;

FIG. 1C shows the equivalent impedance for the low and band pass building blocks;

DESCRIPTION OF THE PREFERRED EMBODIMENT

Figure 2A:
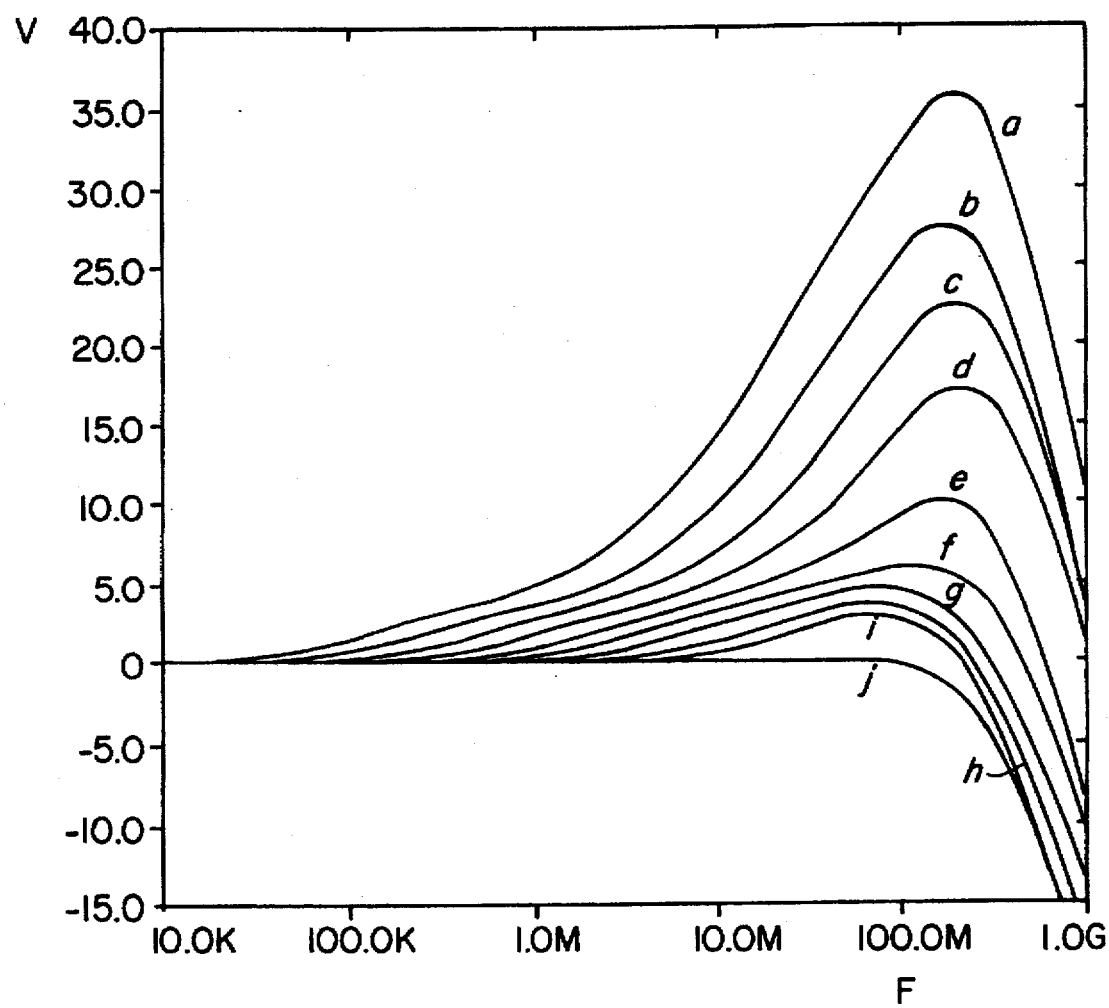
FIG. 2A illustrates a simulated frequency response for a three stage equalizer.

FIG. 1A illustrates the overall structure of an equalizer used for extracting a bandwidth of interest from a received signal.

The pole/zero relationships for the equalizer are chosen to invert the expected loss at high frequencies in signals transmitted over twisted pair cabling. For lossy lines, for example, it is desirable to provide means to echo loss versus frequency characteristics. Thus, the transfer function of the equalizer may be chosen:

$$h(s) = \frac{\left(\frac{s}{\omega_0}+1\right) \cdot \left(\frac{s}{k_{z2}\omega_0}+1\right) \cdot \left(\frac{s}{k_{z3}\omega_0}+1\right)}{\left(\frac{s}{k_{p1}\omega_0}+1\right) \cdot \left(\frac{s}{k_{p2}\omega_0}+1\right) \cdot p(s)}$$

where $k_{z2}$, $k_{z3}$, $k_{p1}$, $k_{p2}$, are the ratios of pole/zero frequencies; and p(s) is the parasitic pole response.

Pole and zero tracking accuracy for an equalizer should be very accurate and dependent upon the conforming impedance only. The minimum parasitic pole frequency $\omega_p$ must be out of band to ensure a minimum preset equalization.

Two different circuit topologies are used for the equalizer stages.

(1) According to this invention, the zeros at high frequency, as is the zero at $k_{z3}\omega_0$, are formed with parallel selectable capacitor-degenerated differential pairs generally referenced as numeral 10 in FIG. 1A. The equivalent impedance of these blocks at high frequencies is shown in FIGS. 1B and 1C. The differential gain of the high frequency building block 10 is controlled with a digital CMOS signal 16, so that the high frequency zeroes may be provided with accuracy and the losses in input signal transmitted over the telephone pair are compensated. Digital control is used to reduce signal coupling. This block is designed to filter signals up to very high frequencies, while adding gain at these high frequencies.

(2) The two poles at $k_{p1}\omega_0$, $k_{p2}\omega_0$ and two lower frequencies zeroes at $k_{z2}\omega_0$ and $k_{z3}\omega_0$ may be formed with differential pair amplifiers degenerated with programmable R-C networks, referenced as numeral 15 in FIG. 1A. The equivalent impedance of these blocks at the frequency of interest is shown in FIG. 1C. The differential gain is controlled with control signals 11 to 14 which set the impedance of the block for a particular resulting response. The two types of building blocks are cascaded, the equalizer receives a differential input signal in$_1$-in$_2$ on the input terminals 4 and 5 and provides a differential output signal out$_1$-out$_2$, on output terminals 8, 9.

FIG. 2A illustrates a simulated frequency response (V/F) for a three stage equalizer. Curves a to h show the programmability of the equalizer using the circuit of this invention. The control word ramp is 0:255 and the value of the word is 255, 128, 64, 32, 16, 8, 4, 2, 1, and 0, respectively.

The low frequency response from 10 kHz to 1 MHz is configured using two filter sections 15 as illustrated in FIGS. 1A and 1C.

Figure 2B:
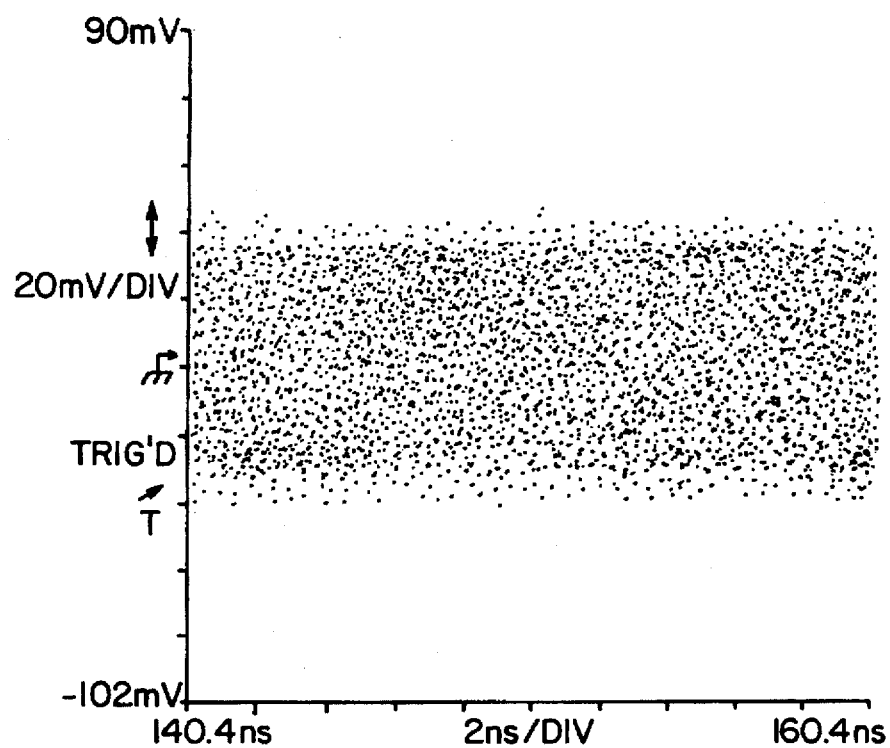
FIG. 2B is an eye diagram showing the data signal without the equalizer.
Figure 2C:
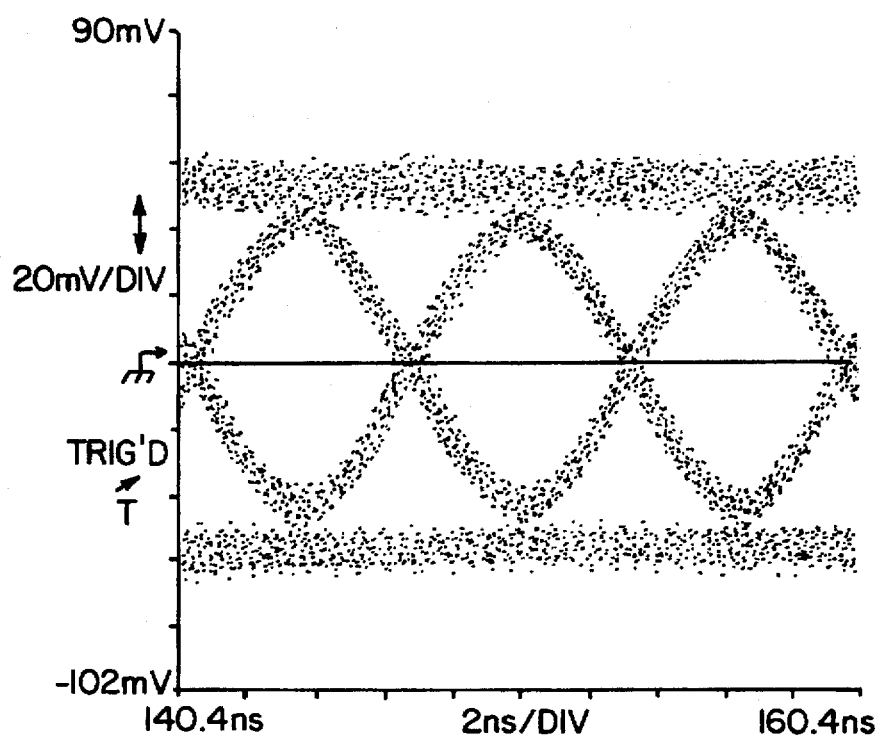
FIG. 2C is an eye diagram showing the equalizer effect on the data signal.

FIG. 2B is an eye diagram illustrating the data signal without the equalizer, while FIG. 2C is an eye diagram showing the equalizer effect on the data signal.

Figure 2D:
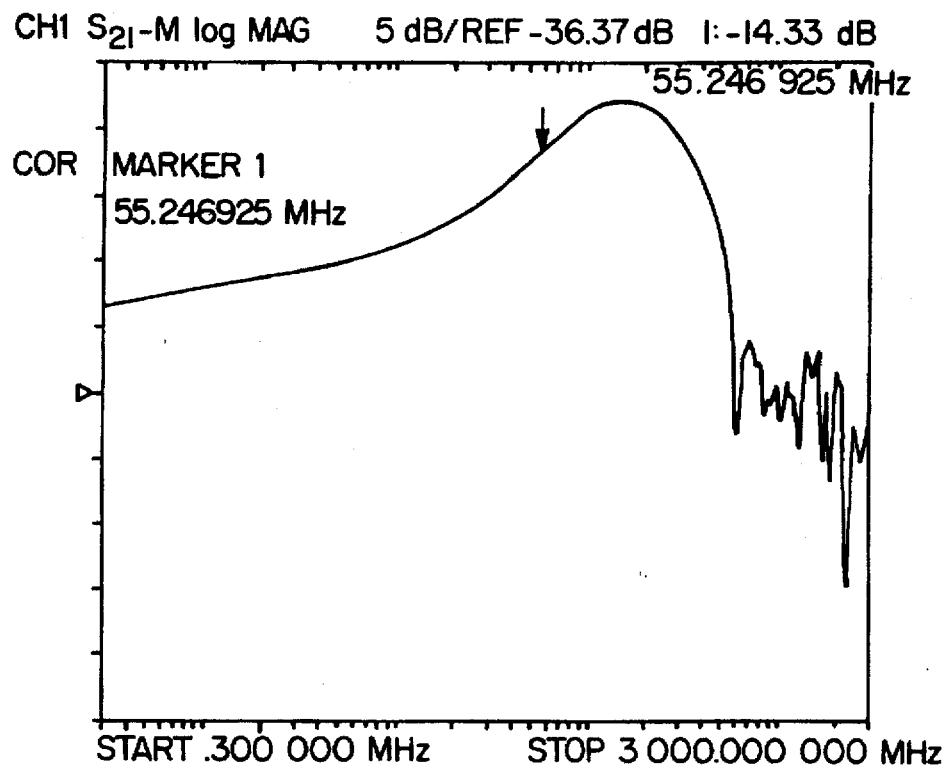
FIG. 2D shows the measured frequency response of the equalizer of FIG. 1A for one particular setting.
Figure 2E:
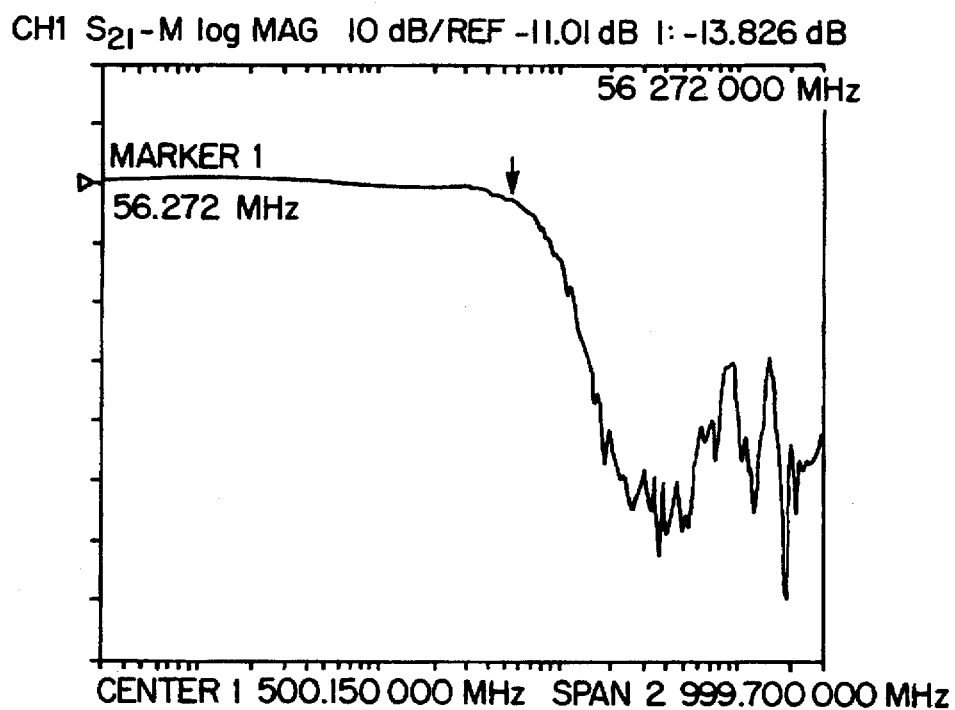
FIG. 2E shows the combined cable and equalizer response.

FIG. 2D is a graph obtained with a network analyzer showing the measured frequency response of the equalizer of FIG. 1A for one particular setting and FIG. 2E shows the combined response of cable and equalizer using a one stage filter according to this invention.

The frequency response is adapted to comply with several conditions of external components, as well as conditions of an integrated circuit, as it may be fabricated.

Nominal constant values for obtaining the frequency response illustrated in FIG. 2E were determined to be: $k_{z2}=10$, $k_{z3}=50$, $k_{p1}=1.44$ and $k_{p2}=14.4$. Pole and zero tracking with this structure of equalizer is better than 1% and the minimum parasitic pole frequency is $\omega_p=200$ MHz. A minimum of 35 dB equalization was obtained experimentally.

Figure 3:
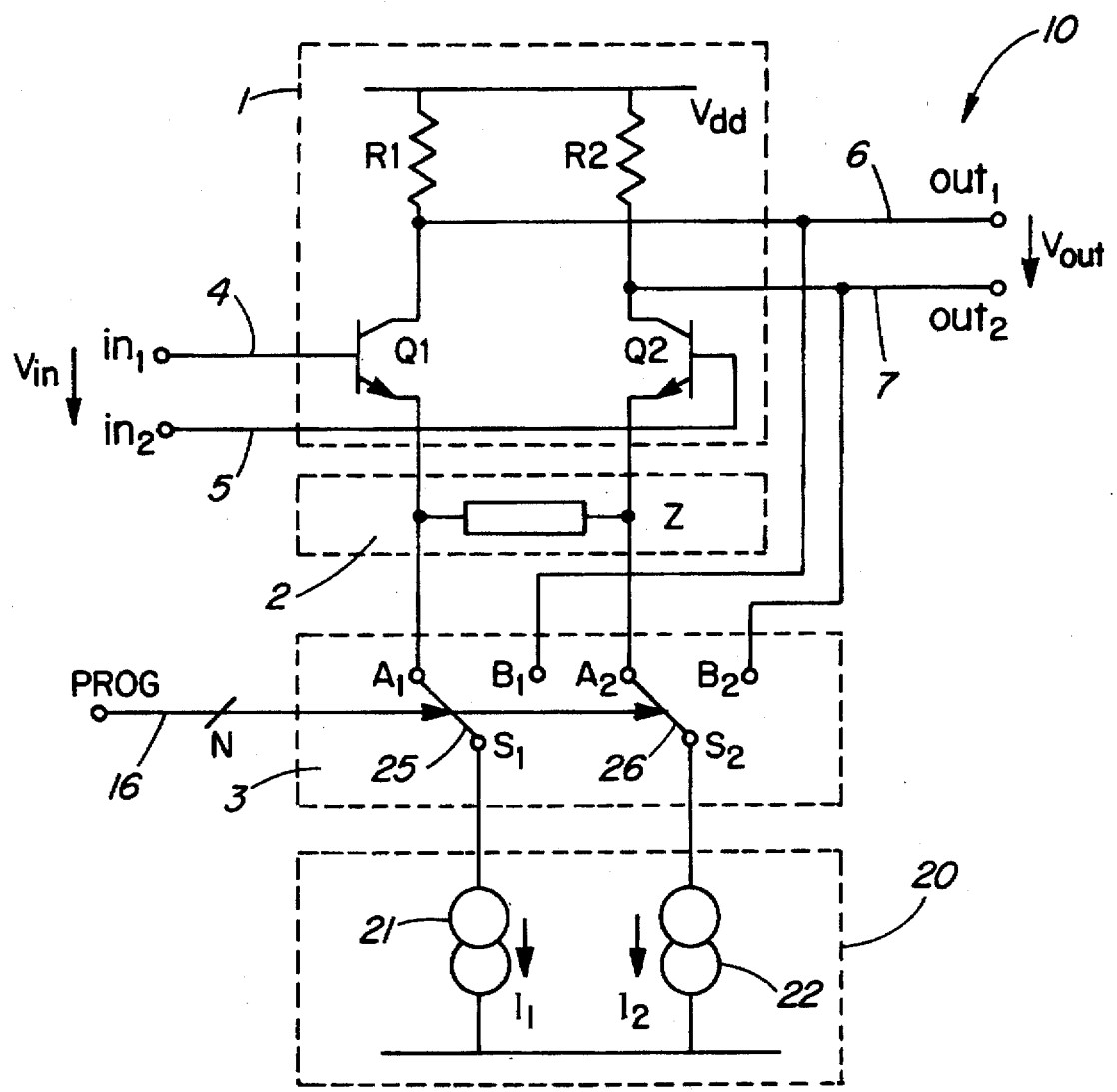
FIG. 3 is a block diagram of a basic building block filter for high frequency zeroes of the frequency response.

FIG. 3 illustrates the general schematic for the high frequency building block 10 in block diagram form. A building block 10 comprises a differential amplifier 1, an impedance block 2, a switching unit 3 and a current source 20. Differential amplifier 1 comprises two matched transistors Q1 and Q2 whose bases are connected to respective differential input terminals 4 and 5. Although each collector is connected to the positive supply voltage $V_{dd}$ through a resistances R1 and R2, this connection is not essential to the operation of the differential pair—that is, in some applications the collectors may be connected to other transistors rather than to resistive loads. It is essential though, that the collector circuits be such that Q1 and Q2 never enter saturation and that the transistors Q1 and Q2 and loads R1 and R2 are matched to each other.

The load resistors $R_1$ and $R_2$ serve to convert the output current to a voltage. Q1 and Q2 receive a high frequency input signal in1 and in2, respectively, on their bases. The important response of the circuit is the differential gain measured from $v_{in}$ ($v_{in}=in_1-in_2$) to $v_{out}$ ($v_{out}=out_1-out_2$).

The impedance block 2 is connected between the emitters of the active devices Q1 and Q2, for reshaping the frequency response of the differential amplifier 1. Transistors Q1 and Q2 are biased by a bias current source 20 comprising two separate constant sources. Current source 21 provides the bias current I1 to transistor Q1 and current source 22 provides the bias current I2 to transistor Q2.

The response of the circuit is modified by adjusting the current input by sources 21 and 22 into the emitters of Q1 and Q2. This is obtained using a switching unit 3 made of switches 25 and 26, which shift currents I1 and I2 between the emitter and collector circuits of the respective transistor. Switches 25 and 26 are controlled by raising or lowering the potential of signal 16 (signal "PROG") to activate or deactivate the differential pair.

When the switching block is in a first state, current source 21 is connected to the emitter of Q1 and current source 22 is connected to the emitter of Q2. A path is completed for the bias current I1 through contacts S1-A1, and for bias current I2 through contacts S2-A2. In this case, active devices Q1 and Q2 are biased in their normal operating range with bias current I1 and I2, respectively. The differential gain of the circuit will be dependent upon the transconductance of Q1 and Q2, and the impedance Z placed between the emitters. If impedance Z is reactive, then the differential output $v_{out}$ is frequency dependent.

When the switching block is in a second state, a path for currents I1 and I2 is established through contacts S1-B1 and S2-B2, respectively. Now the bias currents I1 and I2 traveling through the active devices Q1 and Q2 are reduced and hence the transconductances of Q1 and Q2 are reduced to essentially zero. This has the effect of reducing the differential gain from $v_{in}$ to $v_{out}$ to essentially zero. The common-mode voltage of output signals out$_1$ and out$_2$ is unchanged, since the bias current is maintained through load resistors R1 and R2.

Figure 4:
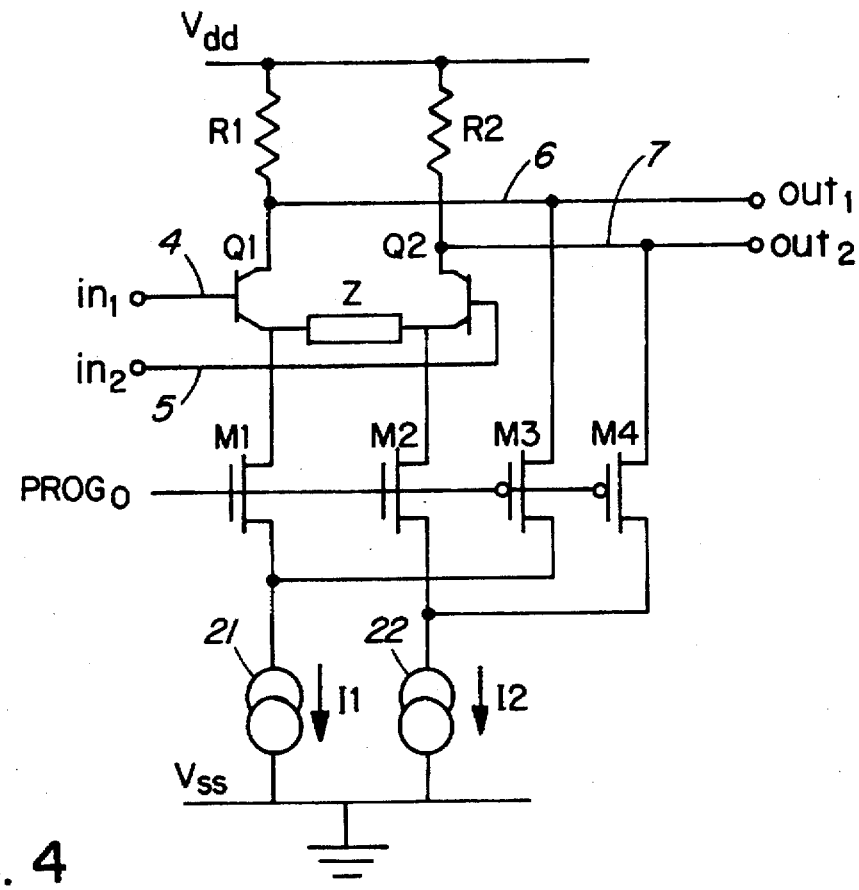
FIG. 4 is an electric schematic of the basic building block of the of the high frequency differential programmable filter.

FIG. 4 illustrates the circuit diagram of the high frequency basic building block 10, showing a preferred embodiment for the switching circuit 3. The switching block 3 is embodied by a current steering switch of the type disclosed in U.S. Pat. No. 5,429,529 (Guay et al., issued May 30, 1995 to Northern Telecom Limited).

The first switch 25 is made by a pair of complementary MOS devices M1 and M3, and the second switch 26 comprises a pair of complementary MOS devices M2 and M4. The first device M1 is connected between the current sources 21 and the emitter of transistor Q1, while the third device M3 is connected between source 21 and the collector of Q1. Similarly, the second device M2 is connected between the current source 22 and the emitter of transistor Q2, while fourth device M4 is connected between source 22 and the collector of Q2.

M1 and M2 are NMOS devices and M3 and M4 are PMOS devices in the embodiment illustrated in FIG. 4. The substrate connections for the devices M1 to M4 are not shown, but are assumed to be appropriate for the fabrication technology. Typically, the PMOS substrates will be connected to $V_{dd}$ and NMOS substrates will be connected to $V_{ss}$.

Devices M1 to M4 are turned "on" or "off" by raising or lowering the potential of the signal "PROG" applied on their gates.

When the signal PROG is at, or near the positive supply rail $V_{dd}$, devices M1 and M2 are "on" while devices M3 and M4 are "off". Active devices Q1 and Q2 are biased in their normal operating range with bias currents I1 and I2, respectively.

If the signal PROG is near, or at the negative supply rail $V_{ss}$, devices M1 and M2 are turned "off", reducing the bias current and hence the transconductance of Q1 and Q2 to zero.

The selection of switches M1 to M4 must be made using criteria such that the circuit elements creating the current sources 21 and 22 are not affected by the impedance of the switches, namely, must always operate as current sources. This, in practice, requires that the "on" drain to source voltage usually not be less than 200–300 mV.

The degeneration networks are completely balanced with respect to parasitics so that any noise injection, including that from noise signals, has a common mode component only. This reduces the effective switch resistance from $(1/gm+R_{MOS})$ to $1/gm$), removing the parasitic poles from the pass-band.

Impedance Z is preferably a capacitor, but can be any realizable network of passive or active components.

Figure 5A:
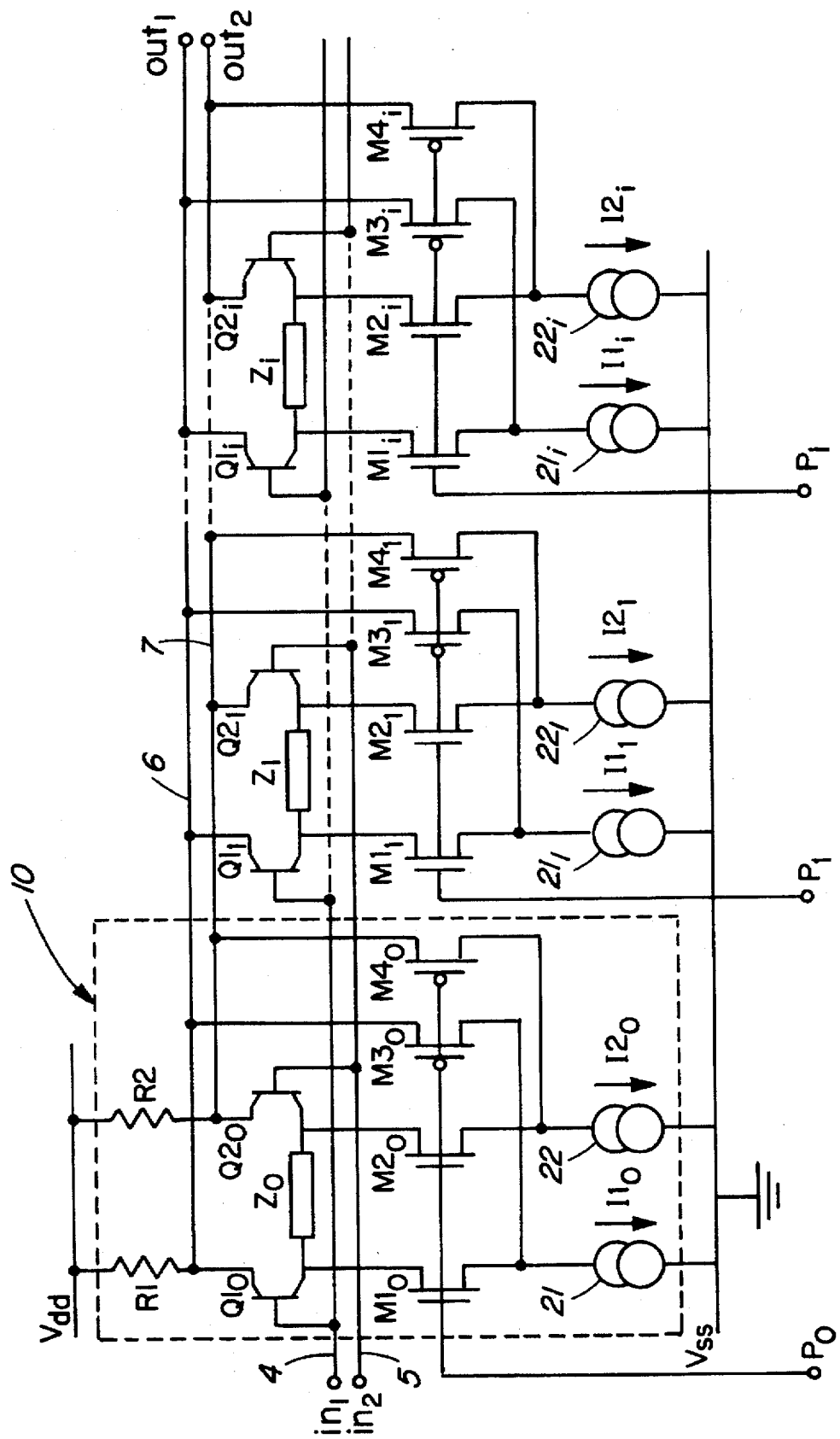
FIG. 5A illustrates the electric schematic of a complex programmable high frequency filter.

Several (N) independently controlled basic building blocks 10 can be paralleled to provide a filter with high frequency gain, with a programmable "corner frequency". Such a filter is illustrated in FIG. 5A. FIG. 5A shows "i" basic building blocks 10 having, respectively, ranges 0, 1 and i, where i is an integer and $i \in [0,N]$. Each block 10 comprises an impedance block 2. All blocks 10 are connected in parallel with the bases of the respective transistor pairs Q1$_i$, Q2$_i$ connected to differential input terminals 4, 5, and with the collectors of transistor pairs Q1$_i$ and Q2$_i$ connected to differential output terminals 6, 7. Resistors R1 and R2 are provided between the output lines and the supply voltage $V_{dd}$.

Each basic block 10 receives a digital signal $P_i$, all digital signals $P_i$ forming the control word PROG. A basic unit is added or subtracted from the filter in accordance with the conducting or non-conducting state of the active devices Q1 and Q2. The control word PROG determines which block contributed to the transfer characteristic of the filter. In this way, the impedance of the resulting filter may be set by varying the number of basic units introduced in parallel.

Figure 5B:
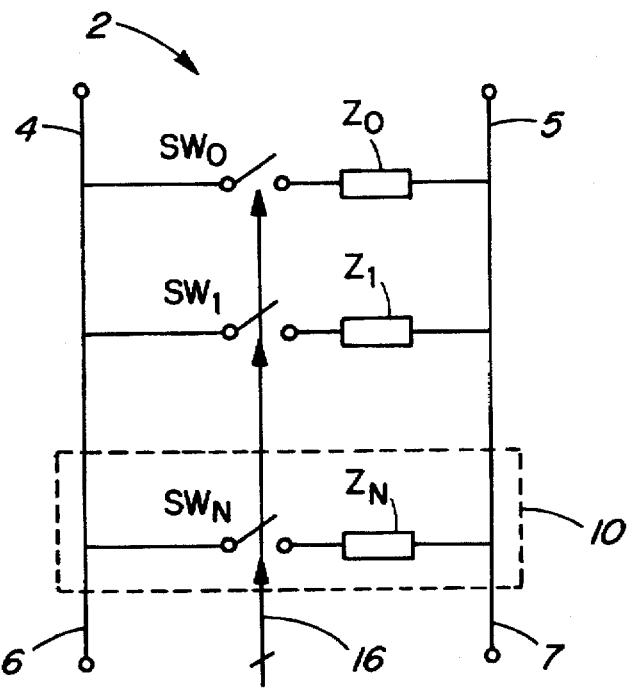
FIG. 5B illustrates the equivalent circuit for a multitude of building blocks connected in parallel.

FIG. 5B illustrates an equivalent circuit for the filter of FIG. 1A. Here, each building block is represented as an impedance $Z_i$ connected in series with a switch $SW_i$. A number (N) of such building blocks is connected in parallel between the input and the output. An impedance block $Z_i$ is added or subtracted from the filter in accordance with the status of the switching circuits $SW_i$. Control of $\omega_0$ is via digital CMOS signal PROG applied on terminal 16. Signal PROG determines which impedance block $Z_i$ contributes to the frequency response.

The transfer function of the high frequency programmable filter of FIGS. 5A and 5B is:

$$\frac{v_0}{v_i} = (R_1 + R_2) \cdot \sum_{i=0}^{N} P_i \cdot \frac{1}{Z_i}$$

where $$P_i = \left\{ \begin{array}{c} 0 \\ 1 \end{array} \right\}$$

is the $i^{th}$ control signal and $Z_i$=s is the domain expression of the $i^{th}$ stage. In the case of one resistor ($R_Z$) and several capacitive impedances $C_i$, the expression would be:

$$\frac{v_0}{v_i} = (R_1 + R_2) \cdot \left[ \frac{1}{R_Z} + (sC_1 \cdot p_1) + (sC_2 \cdot p_2) + (sC_3 \cdot p_3) + \ldots \right]$$

If the value of the capacitances are selected to satisfy the following conditions:

$$C_2 = 2C_1$$
$$C_3 = 2C_2$$
$$\vdots$$
$$C_N = 2C_{N-1},$$

the differential gain becomes:

$$\frac{v_0}{v_i} = \frac{(R_1 + R_2)}{R_z} \cdot [1 + sRC], \text{ where } C = \sum_{i=0}^{N} p_i C_i$$

which is the transfer function of a single variable zero with a $$\left( \frac{R_1 + R_2}{R_z} \right)$$

scaling factor and a zero at $$f = \frac{1}{2\pi RC}$$

The programmable filter disclosed herein may be employed in applications using very high frequency differential signals of various formats. The position of the high frequency zero on the transfer characteristic of the filter may be varied as necessary for a particular application, by Simply using a digital signal, with digits $P_0$ to $P_N$ selected as needed. The filter may be used, for example, to compensate for a lossy element such as a twisted telephone pair or other inherently differential medium, including complementary striplines, ribbon cables, etc. This filter is equally applicable for digital or analog signaling formats.

While the invention has been described with reference to particular example embodiments, further modifications and improvements which will occur to those skilled in the art, may be made within the purview of the appended claims, without departing from the scope of the invention in its broader aspect.

What is claimed is:

1. A programmable high frequency active filter for receiving a differential input signal and providing a differential output signal, said filter comprising:

a differential amplifier comprising a first and a second transistor;

an impedance connected between the emitters of said first and second transistors, for introducing a high frequency zero in said differential output signal; and a switching block for selectively including said high frequency zero in said output differential signal according to a digital control signal.

2. A filter as claimed in claim 1, wherein said first transistor is biased with a first current source, and said second transistor is biased with a second current source.

3. A programmable high frequency active filter for receiving a differential input signal and providing a differential output signal, said filter comprising:

a plurality (N) of differential amplifiers connected in parallel, a differential amplifier $A_i$ comprising a first and a second transistor;

a like plurality (N) of impedance units, an impedance unit $Z_i$ being connected between the emitters of said first and second transistors of said differential amplifier $A_i$ for introducing a high frequency zero in said output differential signal;

a like plurality (N) of switching blocks, a switching block $SW_i$ for selectively including said high frequency zero in said output differential signal according to a digital control signal.

4. A filter as claimed in claim 3, wherein said first transistor is biased with a first current source, and said second transistor is biased with a second current source.

5. A filter as claimed in claim 1, wherein said impedance is a reactance.

6. A filter as claimed in claim 1, wherein said impedance is a capacitive network.

7. A filter as claimed in claim 1, wherein said first and said second transistors are matched to each other.

8. A filter as claimed in claim 2, wherein said switching block comprises:

a first switch for switching the bias current produced by said first current source between the emitter and the collector of said first transistor; and a second switch for switching the bias current produced by said second current source between the emitter and the collector of said second transistor.

9. A filter as claimed in claim 8, wherein said first switch comprises a CMOS pair of a first and a third MOS device and said second switch comprises a CMOS pair of a second and a fourth MOS device.

10. A filter as claimed in claim 9, wherein said first and said second MOS devices are PMOS transistors, and said third and fourth MOS devices are NMOS transistors.

11. A filter as claimed in claim 9, wherein said first MOS device is connected with the drain and source between the emitter of said first transistor and said first current source, and said third MOS device is connected with the source and drain between the collector of said first transistor and said first current source.

12. A filter as claimed in claim 9, wherein said second MOS device is connected with the drain and source between the emitter of said second transistor and said second current source, and said fourth MOS device is connected with the source and drain between the collector of said second transistor and said second current source.

13. A filter as claimed in claim 9, wherein the gates of all said MOS devices are connected to receive said digital control signal.

14. A filter as claimed in claim 3, wherein said impedance unit $Z_i$ is a capacitance.

15. A filter as claimed in claim 4, wherein said switching block $SW_i$ comprises:

a first switch for commuting the bias current produced by said first current source between the emitter and the collector of said first transistor; and a second switch for commuting the bias current produced by said second current source between the emitter and the collector of said second transistor.

16. A filter as claimed in claim 15, wherein said first switch comprises a first CMOS pair of a first and a third MOS device, and said second switch comprises a second pair of a second and a fourth MOS device.

17. A filter as claimed in claim 16, wherein said first and said second MOS devices are PMOS transistors, and said third and fourth MOS devices are NMOS transistors.

18. A programmable high frequency active filter for receiving a differential input signal and providing a differential output signal, said filter comprising:

a differential amplifier comprising a first and second transistor, said first transistor having a first load resistor and being biased with a first bias current source, said second transistor having a second load resistor and being biased with a second bias current source;

a capacitive network connected between the emitters of said first and second transistors for providing a frequency dependent differential voltage gain for said amplifier;

a first MOS device connected with the drain and source between the emitter of said first transistor and said first current source;

a second MOS device connected with the drain and source between the emitter of said second transistor and said second current source;

a third MOS device connected with the source and drain between the collector of said first transistor and said first current source; and a fourth MOS device connected with the source and drain between the collector of said second transistor and said second current source;

wherein the gates of all said MOS devices are connected to receive a digital control signal.

19. A filter as claimed in claim 1, wherein said differential input signal has a format compatible with transmission over a differential medium.

20. A filter as claimed in claim 19, wherein said differential medium is any of a twisted telephone pair, a pair of complimentary striplines, and a ribbon cable.

21. A filter as claimed in claim 1, wherein said differential input signal is a digital signal.

22. A filter as claimed in claim 1, wherein said differential input signal is an analog signal.

* * * * *